United States Patent
Sorokina (10) Patent No.: US 10,218,146 B2
(45) Date of Patent: Feb. 26, 2019

(54) LASER CRYSTAL

(71) Applicant: ATLA LASERS AS, Trondheim (NO)

(72) Inventor: Irina T. Sorokina, Vikhammer (NO)

(73) Assignee: ATLA LASERS AS, Trondheim (NO)

( * ) Notice: Subject to any disclaimer, the term of this patent is extended or adjusted under 35 U.S.C. 154(b) by 0 days.

(21) Appl. No.: 15/031,917

(22) PCT Filed: Oct. 27, 2014

(86) PCT No.: PCT/EP2014/073025
§ 371 (c)(1),
(2) Date: Apr. 25, 2016

(87) PCT Pub. No.: WO2015/059309
PCT Pub. Date: Apr. 30, 2015

(65) Prior Publication Data
US 2016/0268765 A1  Sep. 15, 2016

Related U.S. Application Data (60) Provisional application No. 61/895,810, filed on Oct. 25, 2013.

(51) Int. Cl.
| | | |
|---|---|---|
| H01S 3/098 | (2006.01) | |
| H01S 3/109 | (2006.01) | |
| H01S 3/11 | (2006.01) | |
| H01S 3/16 | (2006.01) | |
| H01S 5/06 | (2006.01) | |
| H01S 3/081 | (2006.01) | |

(52) U.S. Cl.
CPC .......... *H01S 3/1095* (2013.01); *H01S 3/1112* (2013.01); *H01S 3/1118* (2013.01); *H01S 3/1623* (2013.01); *H01S 3/1628* (2013.01); *H01S 5/0605* (2013.01); *H01S 3/0816* (2013.01)

(58) Field of Classification Search
CPC .... H01S 3/1095; H01S 3/1112; H01S 3/1118; H01S 3/1623; H01S 3/1628; H01S 3/0816; H01S 3/11; H01S 3/1106; H01S 3/1121; H01S 3/0602; H01S 3/0617; H01S 3/0608; H01S 3/163; H01S 3/109; H01S 3/0092; H01S 3/2325; H01S 3/235; H01S 5/0605;
(Continued)

(56) References Cited

U.S. PATENT DOCUMENTS

| | | | |
|---|---|---|---|
| 5,422,903 A | | 6/1995 | Yamada |
| 5,541,948 A | * | 7/1996 | Krupke ................... H01S 3/16 372/41 |

OTHER PUBLICATIONS

Hannah J. Joyse et al. "Phase perfection in Zinc Blende and Wurtzite III-V Nanowires using basic growth parameters", Nano Letters, 2010, pp. 909-915.*
(Continued)

*Primary Examiner* — Tod T Van Roy
*Assistant Examiner* — Delma R Forde
(74) *Attorney, Agent, or Firm* — Eversheds Sutherland (US) LLP (57) ABSTRACT

The present disclosure provides a method of optimising an optical system of a mode-locked laser oscillator or a regenerative, multi-pass or single pass amplifier. The method may include the steps of identifying crystallographic axes of an active laser gain medium crystal, cutting the crystal, and orienting the crystal in the optical system in a predetermined orientation relative to a propagation vector of a laser pulse depending on the required output of the optical system.

11 Claims, 5 Drawing Sheets

(58) Field of Classification Search
CPC ........ H01S 5/06; H01S 5/0092; H01S 5/0604; H01S 5/2201
See application file for complete search history.

(56) References Cited

OTHER PUBLICATIONS

T. Ohtoshi et al. "Orientation dependence of optical gain in Zincblende-GaN strained-quantum-well lasers" IEEE Journal of selected topics in quantum electronics, vol. 4, No. 3, May/Jun. 1998, pp. 527-530.*

E. Sorokin et al. "Kerr-Lens mode-locked Cr:ZnS Laser" Laser, sources and related photonic device technical digest, Jan. 9, 2012, pp. 1-3.*

E. Sorokin, "Femtosecond operation and random quasi-phase-matched self-doubling of ceramic Cr:ZnSe laser", IEEE OSA/CLEO/QELS 2010, pp. 1-2.*

Ming-Liang Ren et al. "Crystollographic characterization of II-VI semiconducting nanostructures via opcital second harmonic generation" Nano Letters, 2015, 15, 7341-7346.*

Lederer M J, et al.: "Passive mode locking of a self-frequency-doubling Yb:YAl3(BO3)4 laser", Optics Letters, Optical Society of American, vol. 27, No. 6, Mar. 15, 2002, pp. 436-438, US.

Yanrong Song, et al.: "Polarized operation of Yb:YAl3(BO3)4CW and mode-locked lasers", Proceedings of SPIE, vol. 5460, Sep. 1, 2004, pp. 51-55, US.

Evgeni Sorokin, et al.: "Femtosecond operation and self-doubling of Cr:ZnS laser", Nonlinear Optics, Jul. 17, 2011-Jul. 22, 2011, p. NThC1, US.

* cited by examiner

LASER CRYSTAL

TECHNICAL FIELD

The present invention relates to an optical system for a mode-locked laser oscillator or a regenerative, multi-pass or single pass amplifier. It can also be seen to relate to an active laser crystal as a part of an optical system for an ultrashort-pulsed laser system, in particular, an optical system for efficient generation of ultra-short laser pulses of both picosecond as well as femtosecond pulse duration and emitting at the fundamental wavelength and/or second-harmonic wavelength.

BACKGROUND OF THE INVENTION

In ultra-short pulsed laser systems the active laser crystals (semiconductor or dielectric) with laser-active dopants are used as the laser gain media as well as simultaneously as the nonlinear media for generation of ultrashort-pulses by various passive- and passive/active mode-locking mechanisms. Very often these crystals possess high optical nonlinearity, both second order and third order. This is, for example, the case in zinc-blende and wurtzite semiconductors and in particular, in transition-metal-doped chalcogenides, where the second order and third order nonlinearities coexist.

The generation of the second harmonic during the propagation of an ultrashort pulse inside a dispersive medium (both phase-matched and non-phase-matched) is accompanied by accumulation of a group delay between the fundamental and the second harmonic waves due to a naturally occurring group velocity mismatch between the two wavelengths.

For a non-phase-matched crystal, where the second harmonic signal for a monochromatic wave would periodically back-convert to the fundamental and return to zero at propagation distances equal to even number of coherence lengths, this group velocity mismatch would result in a constant increase of the second harmonic generation intensity, because the group delay prevents complete back-conversion of the second harmonic wave to the fundamental. In the case of typical dispersion values in dense media the group-velocity mismatch may be of the order of hundreds of femtoseconds per millimetre of propagation distance.

For an ultrashort pulse with duration of shorter than a few hundred femtoseconds, the second-harmonic signal turns to a long tail that drags behind the fundamental pulse, only partially overlapping with it in time. In case of a picosecond-scale chirped pulse, the second harmonic signal generally has better overlap with the chirped fundamental pulse, and interaction of the generated and retarded second harmonic radiation with the chirped fundamental becomes even more involved and may result in spectral and temporal modulation of the fundamental pulse.

In a typical mode-locked solid-state laser cavity, or in a regenerative or multi-pass amplifier with at least one mirror being physically separated from the crystal, both second harmonic and fundamental pulses will re-enter the crystal with an additional phase and group delay accumulated during the propagation in the free space (e.g. atmosphere), dispersion-compensating elements, and the mirror coatings. After re-entrance into the crystal, the second harmonic generation will resume, with the sign and efficiency depending upon the accumulated delays. This process thus becomes sensitive to the mirror and crystal positions, ambient temperature, insertion of the wedged elements, etc., and can result in saturable or inverse saturable absorber effect (see for example K. A. Stankov, "A mirror with an intensity-dependent reflection coefficient," Appl. Phys. B 45, 191-195 (1988)). This may cause disruption of mode-locking, spectral and temporal modulation of the pulse, and may strongly increase the environmental sensitivity of the system.

The efficiency of fundamental to second harmonic conversion increases with peak intensity (pulse shortening and/or energy increase) and may reach a few percent already in low power Cr:ZnSe (or Cr:ZnS) modelocked oscillators with a pulse duration of the order of 100 femtoseconds (see for example, E. Sorokin, N. Tolstik and I. T. Sorokina "Femtosecond operation and self-doubling of Cr:ZnS laser" at Nonlinear Optics' 2011 conference, OSA Technical Didest, paper NTHC1; and E. Sorokin, I. T. Sorokina "Femtosecond operation and random quasi-phase-matched self-doubling of ceramic Cr:ZnSe laser", OSA Technical Digest, paper CTUGG2 at Conference on Lasers and Electrooptics CLEO'2010). For higher energies and/or shorter pulses this conversion efficiency may become even higher, starting to compete with the mode-locking mechanism and causing pulse break-up, etc. Growth of the second harmonic conversion efficiency with peak power is equivalent to an inverse saturable absorber acting on the pulse at fundamental wavelength.

When a polycrystalline material is used, besides the main pulse at the fundamental wavelength, the laser emits radiation also at the second harmonic wavelength (see for example E. Sorokin, N. Tolstik and I. T. Sorokina "Femtosecond operation and self-doubling of Cr:ZnS laser" at Nonlinear Optics'2011 conference, OSA Technical Didest, paper NTHC1; and E. Sorokin, I. T. Sorokina "Femtosecond operation and random quasi-phase-matched self-doubling of ceramic Cr:ZnSe laser", OSA Technical Digest, paper CTUGG2 at Conference on Lasers and Electrooptics CLEO'2010).

SUMMARY OF THE INVENTION

For crystals with a cubic structure (such as zinc blende), it was previously assumed that crystal orientation did not affect the laser output (in particular the degree of generation of second harmonic radiation). However, the present inventor has found that, for ultrashort pulses, the point group also becomes important (as well as its crystal system), and orientation of the crystal does affect the degree of generation of second harmonic radiation, contrary to the prevailing technical prejudice in the art.

According to a first aspect of the present invention, there is provided an optical system for a mode-locked laser oscillator (preferably for an ultrashort pulse laser system) or a regenerative, multi-pass or single pass amplifier, the optical system comprising: an active laser gain medium having a crystalline structure with second order and third order optical non-linearity, wherein the active laser gain medium is orientated relative to a propagation vector of a laser pulse of laser radiation to control generation of a second harmonic of the laser radiation.

Here, "ultrashort" refers to laser pulses with temporal width of less than 1 nanosecond.

According to a second aspect of the present invention, there is provided a method of optimising an optical system of a mode-locked laser oscillator or a regenerative, multi-pass or single pass amplifier comprising: identifying crystallographic axes of an active laser gain medium crystal; cutting the crystal; and orienting the crystal in the optical system in a predetermined orientation relative to a propagation vector of a laser pulse depending on the required output of the optical system.

According to a third aspect of the present invention, there is provided a laser amplifier comprising: an active laser gain medium having a crystalline structure with second- and third-order optical non-linearity, wherein the active laser gain medium is orientated relative to a propagation vector of a laser pulse of laser radiation to control generation of a second harmonic of the laser radiation.

A laser amplifier with the preferred features of the optical system of the first aspect, fifth aspect or sixth aspect, as described herein, is also within the scope of the invention.

A laser amplifier according to the third aspect, or a laser amplifier incorporating the preferred features of the optical system of the first aspect, fifth aspect or sixth aspect, is advantageously capable of producing higher pulse energies than could previously be produced (with correct orientation of the crystal in the amplifier, to reduce second harmonic generation). This can potentially allow use of such systems in a new set of applications, for example, in material processing.

The invention, along with the preferred features thereof, as discussed below, can be used in a wide variety of optically pumped semiconductor lasers, including but not limited to: semiconductor and solid-state thin disk lasers; vertical external-cavity surface-emitting lasers; other external cavity hybrid mode-locked diode lasers, as well as mode-locked wave-guide and fiber lasers.

According to an embodiment of the first aspect of the invention, the active laser gain medium has a zinc-blende type crystal structure and is oriented such that the propagation vector of the laser pulse is parallel to one of the [100], [010], or crystallographic axes to reduce the generation of the second harmonic radiation. Correspondingly, in an embodiment of the second aspect of the invention, the active laser gain medium has a zinc-blende type crystal structure, and the method comprises: orienting the crystal such that the propagation vector of the laser pulse is substantially parallel to one of the [100], [010], or [001] crystallographic axes to reduce the generation of second harmonic radiation.

Alternatively, according to another embodiment of the first aspect of the invention, the active laser gain medium may have a wurtzite type crystal structure and is oriented such that the propagation vector of the laser pulse is parallel to the [0001] crystallographic axis to reduce the generation of the second harmonic radiation. Correspondingly, in an embodiment of the second aspect of the invention, the active laser gain medium has a wurtzite type crystal structure, and the method comprises: orienting the crystal such that the propagation vector of the laser pulse is substantially parallel to the [0001] crystallographic axis to reduce the generation of second harmonic radiation.

In general, crystals are designed to have light incident either normally, or incident at the Brewster angle, depending on the way that the crystal is cut. Other angles of incidence may of course be possible. To make sure that the propagation vector of the laser pulse in the laser crystal is oriented in a predetermined way with respect to a predetermined crystallographic axis (in order to either eliminate a second harmonic or to increase a second harmonic), the desired angle of incidence must be considered, and then the crystal may be cut at the correct angle relative to the predetermined crystallographic axis.

The angle that the cut face of the crystal makes with respect to the crystallographic axis is denoted by $\Phi$. By Snell's Law, when the propagation vector of the laser pulse within the laser crystal is substantially parallel to the predetermined crystallographic axis (to eliminate the second harmonic), $\Phi$ is given by the following equation:

$$\Phi = 90 - \arcsin\left(\frac{n_1}{n_2}\sin\theta_i\right)$$

Here, $\theta_i$ is the angle of incidence, $n_1$ is the refractive index of the medium through which the laser propagates before being incident upon the crystal (usually air) and $n_2$ is the refractive index of the crystal.

In embodiments where it is desirable for the output of the system to include the second harmonic (i.e. the propagation vector of the laser pulse within the laser crystal is not substantially parallel to the predetermined crystallographic axis), then $\Phi$ can take any value between 0° and 90° except for:

$$90 - \arcsin\left(\frac{n_1}{n_2}\sin\theta_i\right)$$

This is summarised, in general, in the following table for zinc-blende and wurzite:

| | Zinc-blende | Wurzite |
|---|---|---|
| Fundamental only | Cut so that: $\Phi = 90 - \arcsin\left(\frac{n_1}{n_2}\sin\theta_i\right)$ relative to one of the [100], [010] or [001] axes | Cut so that $\Phi = 90 - \arcsin\left(\frac{n_1}{n_2}\sin\theta_i\right)$ relative to the [0001] axis |
| Fundamental and second harmonic | Cut so that: $\Phi \neq 90 - \arcsin\left(\frac{n_1}{n_2}\sin\theta_i\right)$ relative to one of the [100], [010] or [001] axes | Cut so that $\Phi \neq 90 - \arcsin\left(\frac{n_1}{n_2}\sin\theta_i\right)$ relative to the [0001] axis |

Thus, according to a fourth aspect of the present invention, there is provided a method of optimising an optical system of a mode-locked laser oscillator or a regenerative, multi-pass or single pass amplifier comprising:

identifying crystallographic axes of an active laser gain medium crystal having refractive index $n_2$;

choosing the desired angle of incidence $\theta_i$ of laser pulses on the crystal, the laser pulses being incident from a medium with refractive index $n_1$;

cutting the crystal so that the cut face is at an angle $\Phi$ to a predetermined crystallographic axis so that either:

$$\Phi = 90 - \arcsin\left(\frac{n_1}{n_2}\sin\theta_i\right)$$

and the propagation vector of the laser pulses incident at the desired angle of incidence $\theta_i$ is parallel to the predetermined crystallographic axis, to minimise generation of a second harmonic, or $$\Phi \neq 90 - \arcsin\left(\frac{n_1}{n_2}\sin\theta_i\right)$$

and the propagation vector of the laser pulses incident at the desired angle of incidence $\theta_i$ is not parallel to the predetermined crystallographic axis, to increase generation of the second harmonic;

and orienting the crystal in the system so that the laser pulses are incident on the crystal at the desired angle of incidence $\theta_i$.

Preferably, for a zinc-blende structure, the predetermined crystallographic axis may be one of the [100], [010] or [001] axes. Preferably, for a wurtzite structure, the predetermined crystallographic axis is the [0001] axis.

According to a fifth aspect of the present invention, there is provided an optical system of a mode-locked laser oscillator or a regenerative, multi-pass or single-pass amplifier comprising: an active laser gain medium crystal having refractive index $n_2$, the optical system being configured such that laser pulses are incident on the crystal at a predetermined angle of incidence $\theta_i$ from a medium preceding the crystal having refractive index $n_1$, wherein the crystal has a cut face which is at an angle $\Phi$ to a predetermined crystallographic axis of the crystal so that:

$$\Phi = 90 - \arcsin\left(\frac{n_1}{n_2}\sin\theta_i\right)$$

whereby, the crystal is configured to minimise generation of a second harmonic.

Preferably, for a zinc-blende structure, the predetermined crystallographic axis may be one of the [100], [010] or [001] axes. Preferably, for a wurtzite structure, the predetermined crystallographic axis is the [0001] axis. According to a sixth aspect of the present invention, there is provided an optical system of a mode-locked laser oscillator or a regenerative, multi-pass or single-pass amplifier comprising: an active laser gain medium crystal having refractive index $n_2$, the optical system being configured such that laser pulses are incident on the crystal at a predetermined angle of incidence $\theta_i$ from a medium preceding the crystal having refractive index $n_1$, wherein the crystal has a cut face which is at an angle $\Phi$ to a predetermined crystallographic axis of the crystal so that:

$$\Phi \neq 90 - \arcsin\left(\frac{n_1}{n_2}\sin\theta_i\right)$$

whereby, the crystal is configured to increase generation of a second harmonic.

Preferably, for a zinc-blende structure, the predetermined crystallographic axis may be one of the [100], [010] or [001] axes. Preferably, for a wurtzite structure, the predetermined crystallographic axis is the [0001] axis.

The foregoing optical systems (of the first, third, fifth and sixth aspects, and preferably also including any of the foregoing preferred features thereof) may include an optical element for preventing return of a second harmonic of the laser radiation to the active laser gain medium. Correspondingly, the foregoing methods (of the second or fourth aspects, and preferably also including any of the foregoing preferred features thereof) may include the step of providing an optical element for preventing return of the second harmonic radiation to the optical system.

In the foregoing optical systems and methods, the optical element for preventing return of a second harmonic of the laser radiation to the active laser gain medium may comprise a mirror having a reflection coefficient in the second harmonic wavelength range that is smaller than the reflection coefficient in the fundamental wavelength range. Alternatively or additionally, the optical element may comprise an intracavity element with higher absorption in the second harmonic wavelength range compared to absorption in the fundamental wavelength range.

The optical system may additionally or alternatively comprise an optical element for providing a group delay of the second harmonic radiation with respect to a laser pulse that is longer than a duration of the laser pulse. Such an optical element may be provided in the case in which the second-harmonic radiation is not a useful output, and also in the case where the second harmonic is a useful output of the system. In both cases, it is desirable to decrease the negative consequences of the nonlinear mirror effects and other nonlinear effects such as temporal or spectral modulation, mode-locking instability, and environmental sensitivity (caused by the fundamental and second harmonic pulses overlapping).

The optical element for providing a group delay of the second harmonic radiation with respect to a laser pulse that is longer than a duration of the laser pulse may be an intracavity element. Preferably, the intracavity element providing the additional delay is a bulk dispersion compensator, a prism pair, a wedge or a wedge pair, a dispersion-controlling chirped mirror, or a Gires-Tournois interferometer. Correspondingly, the method may comprises the step of providing any of the above elements for providing a group delay of the second harmonic radiation with respect to a laser pulse that is longer than a duration of the laser pulse.

The optical system may additionally or alternatively comprise a cavity mirror, wherein the second harmonic radiation reflected or transmitted by the cavity mirror is used to measure and control the carrier-envelope offset frequency of the fundamental pulse according to the f-2f scheme. Correspondingly, the method may comprise the step of using the second harmonic radiation reflected or transmitted by a cavity mirror to measure and control a carrier-envelope offset frequency of a fundamental pulse according to the f-2f scheme.

The optical system may additionally or alternatively comprise a cavity mirror, wherein the second harmonic radiation reflected or transmitted by the cavity mirror is used as an additional output of the laser. The second harmonic radiation reflected or transmitted by the cavity mirror may be used as the main useful output of the laser, with no or very little output at the fundamental wavelength. Correspondingly, the method may comprise using the second harmonic radiation reflected or transmitted by a cavity mirror as an additional output of the laser optical system.

The active laser gain medium may be a single crystal material. Alternatively, the active laser gain medium may be a polycrystalline material.

The active laser gain medium may comprise a host material selected from the group consisting of sulfides, selenides, and tellurides, and/or may comprise a transition metal ion dopant in the host material. In particular, the transition metal ion may have a $3d^4$, $4d^4$, $5d^4$, $3d^6$, $4d^6$, or $5d^6$ electronic structure and by ground and excited states described by $^5T_2$ and $^5E$ tetrahedral symmetries; the host material may have a crystal structure having four fold coordinated substitutional sites; the transition metal ion dopant may be substituted at said four-fold coordinated sites; and the host material may have a non-centrosymmetric crystal structure.

The transition metal ion dopant may be selected from the group consisting of Ti, V, Cr, Mn, Fe, Co, Ni, and Cu, and in particular may the transition metal ion may be $Cr^{2+}$ or $Fe^{2+}$.

The host material may be group II-VI compound having the formula MX, where M is a divalent cation selected from the group consisting of Mg, Zn, and Cd, or a combination of those, and X is a divalent anion selected from the group consisting of S, Se and Te, or a combination of those. In particular, said host material may be selected from the group consisting of ZnS, ZnSe, ZnTe, CdS, CdSe and CdTe. The transition metal ion may be $Cr^{2+}$.

Figure 1:
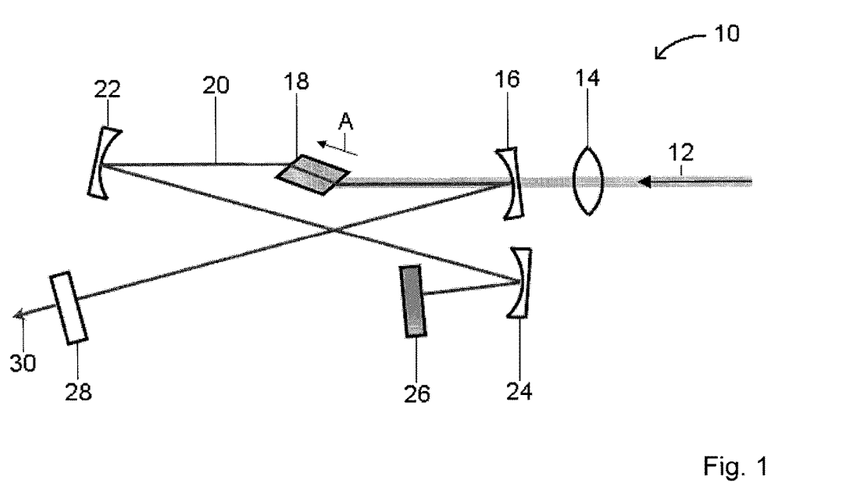
FIG. 1 shows a Cr:ZnS femtosecond laser.

FIG. 1 shows a laser as used in the paper entitled "Femtosecond operation and self-doubling of Cr:ZnS laser". The system 10 comprises an active element 18 which is a 2.5 mm thick uncoated plate of ceramic $Cr^{2+}$:ZnS, with over 90% absorption at 1.61 μm. A semiconductor saturable absorber mirror (SESAM) 26 comprises a saturable absorber based on 50 layers of InAs/GaSb quantum wells, grown on top of a dielectric mirror made from 15 alternating layers of quarter-wave thickness GaSb and $AlAs_{0.08}Sb_{0.92}$ on a GaSb substrate.

An X-fold cavity configuration with the SESAM was optimized for reliable self-starting. The cavity consists of two concave mirrors 16, 22 with 75 and 100 mm 25 radii of curvature, a folding mirror 24 with 75 mm radius of curvature, which focuses light 20 into a 50 μm spot diameter onto the SESAM 26, and a plane 2% output coupler 28. For dispersion compensation, a single 3-mm thick YAG plate and one dispersive mirror were used. A diode-pumped Er-fiber laser 12 was focussed onto the crystal 18 through a lens 14.

Figure 2:
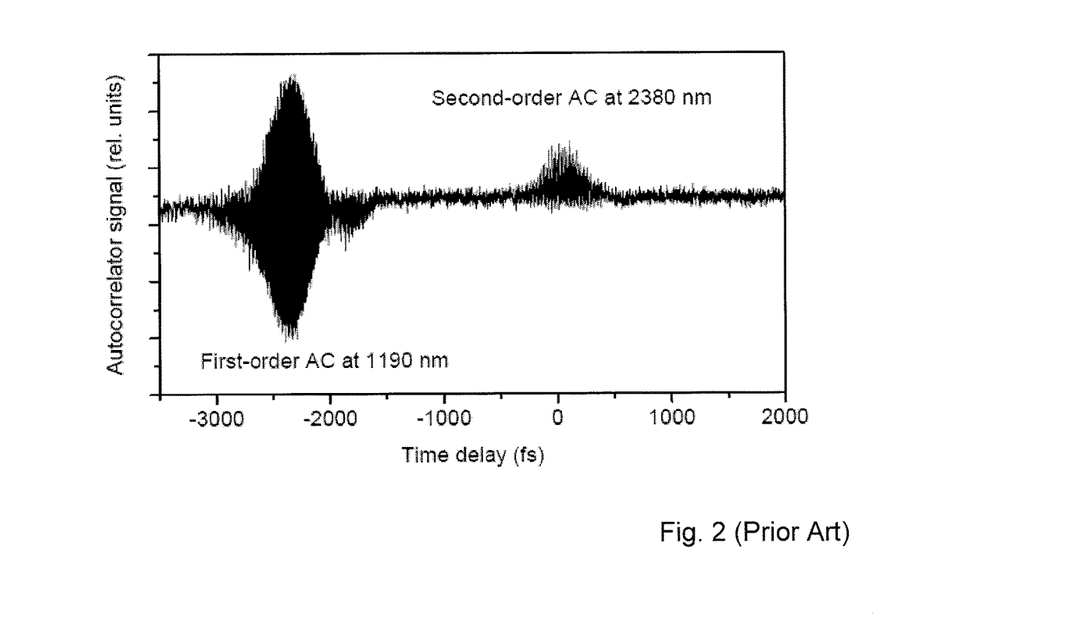
FIG. 2 shows the output of the system using a polycrystalline active medium.

The output 30 of this system in shown in FIG. 2, which shows an autocorrelation trace of the mode-locked Cr:ZnS ceramic laser. FIG. 2 shows the first-order interferogram of the second harmonic radiation at −2.2 ps time delay with respect to the second-order autocorrelation peak at 0 ps. Thus, besides the main pulse at 2380 nm, the laser also emits radiation at a second harmonic around 1190 nm. The observed second harmonic is due to the fact that the ceramic sample consists of a multitude of differently oriented microcrystals, providing for the quasi-regular switch of the nonlinear interaction phase.

It has been discovered by the present inventor that maximizing efficiency and power of ultra-short laser pulses and/or directed control of simultaneous generation of the ultrashort pulses at the second harmonic frequency can be achieved through particular orientation of the active laser crystal with respect to the laser resonator beam or laser beam to be amplified. This optimization is somewhat similar to the one done in orientation-patterned nonphase-matched cubic zinc-blende semiconductors with the purpose of enhancement of second-harmonic generation, with the difference that in the ultra-short pulsed lasers one has to minimize the effect of the second-order nonlinearity.

Active laser crystals for ultrashort pulse generation, such as Cr:ZnS and Cr:ZnSe, are the most structurally rich chalcogenide compounds. Besides the two basic wurtzite (hexagonal) and zinc-blende (cubic) structures, a number of mixed-polytype structures are common. In this case the stacking order of successive anion and cation planes along the hexagonal [0001] c-axis (which corresponds to the cubic [111] axis) is disturbed and the repeating periods are longer.

There are many factors influencing the mixed-polytype formation and the degree of hexagonality, including temperature of crystallization, stress, pressure and doping with active ions. But even in purely cubic crystals, intelligent crystal design and control of orientation can significantly suppress the effect of second-harmonic generation.

For crystals with a cubic structure (such as zinc blende), it was previously assumed that crystal orientation did not affect the laser output (in particular the degree of generation of second harmonic radiation). However, the present inventor has found that, for ultrashort pulses, the point group also becomes important (as well as its crystal system), and orientation of the crystal does affect the degree of generation of second harmonic radiation, contrary to the prevailing technical prejudice in the art.

For maximization of the efficiency, power, and stability of ultrashort pulses generated at the fundamental wavelength, the crystal with zinc-blende structure (independently from its size or form) should be cut in a way that the propagation vector of the light pulse is parallel to one of the crystallographic axes of the cubic crystal [100], [010], or [001] (crystallographic axis [0001] for wurtzite structure).

Complete suppression of the second harmonic generation can be achieved in single crystals by their proper orientation with respect to light propagation: in zinc-blende structure (e.g. cubic ZnSe, cubic ZnS, etc.) by orientating the propagation vector of the light pulse along one of the crystallographic axes of the crystal [100], [010], or [001]; and in wurtzite structure (e.g. CdS, CdSe, GaAs, hexagonal ZnS, etc.) by orientating the propagation vector of the light pulse along the c axis of the crystal (crystallographic axis [0001]).

For arbitrarily orientated crystals or polycrystalline materials with random orientation of grains second harmonic generation cannot be suppressed completely. Moreover, the second harmonic generation can be quite efficient in the polycrystalline materials due to the random quasi-phase matching process (see for example M. Baudrier-Raybaut, R. Haïdar, P. Kupecek, P. Lemasson, E. Rosencher, "Random quasi-phase-matching in bulk polycrystalline isotropic nonlinear materials," Nature 432, 374-376 (2004)).

Suppressing the nonlinear mirror effect (or other nonlinear effects) due to the second harmonic radiation re-entering the crystal can be achieved by the following means: mirror coatings, providing low reflectivity for the second harmonic wavelength range; intracavity elements, transparent for fundamental but strongly absorbing at second harmonic wavelength. These can be combined with dispersion-control elements such as prisms, wedges and bulk compensators; and mirror coatings and intracavity elements, which, while maintaining respectively high reflectivity and transparency for the second harmonic wavelength, provide such group delay between the second harmonic and fundamental pulses, as to prevent their overlap upon re-entry into the crystal.

Finally, the second harmonic generation from the ultrashort pulses, inside the oscillator allows using it for specific applications, such as carrier-envelope offset detection and control. In this case an oscillator with an octave-spanning spectrum and generating intracavity second harmonic signal will (given the correct transmission curves of the corresponding mirrors) also provide the second harmonic signals for the f-2f carrier-envelope-offset scheme, thus sparing the necessity of setting up an additional extra-cavity second harmonic generation and beam splitting-recombination schemes.

The invention describes an optical system for a mode-locked laser oscillator or a regenerative, multi-pass or single pass amplifier and a corresponding method which can avoid second harmonic generation in non-centrosymmetric crystals of zinc-blende and wurtzite structure. It can control the effects of the second harmonic on ultrashort-pulse oscillators and amplifiers with active elements made of un-oriented or polycrystalline materials of the said kind, and provides a use of the second harmonic for the purposes of carrier-frequency offset detection and control.

The invention can be used in ultrashort-pulsed laser systems not only for scientific, but also for industrial applications such as fine material processing, oil and gas sensing, environment monitoring, and medicine.

The advantage of the correctly oriented crystal is higher efficiency of generation of ultrashort pulses leading to higher power and shorter pulse duration as compared to the existing non-oriented active laser elements, as well as the possibility of controllable generation of these pulses simultaneously at the second harmonic wavelength.

These and other features and improvements of the present application and the resultant patent will become apparent to one of ordinary skill in the art upon review of the following detailed description when taken in conjunction with the several drawings and the appended claims.

BRIEF DESCRIPTION OF THE DRAWINGS

A preferred embodiment will now be described in greater detail by way of example only and with reference to the accompanying figures in which.

DETAILED DESCRIPTION

As described above, using a polycrystalline crystal into the system of FIG. 1 results in generation of second harmonic radiation (as shown in FIG. 2). If, instead of putting a polycrystalline crystal into the system of FIG. 1, a single crystal is used as an active medium, the crystal can be cut in such a way as to set in advance the degree of generation of the second harmonic radiation.

Whilst this is also applicable to polycrystalline laser gain media (particularly those with large crystals) the effect is most pronounced with single crystals.

In polycrystalline materials, the individual crystals may be quite large. In that case, the crystal can be cut and oriented such that the laser radiation is parallel to an axis of the larger crystals. In polycrystalline materials, the individual crystals may have common or predominant orientation, which can occur naturally or be induced artificially. In that case, the crystal can be cut and oriented such that the laser radiation is parallel to the axis of the dominant orientation.

To reduce the second harmonic radiation, the crystal should be oriented such that the laser radiation is parallel to a particular one of the crystallographic axes A (see FIG. 1) of the crystal. The particular axis depends on the type of crystal structure.

Figure 3A:
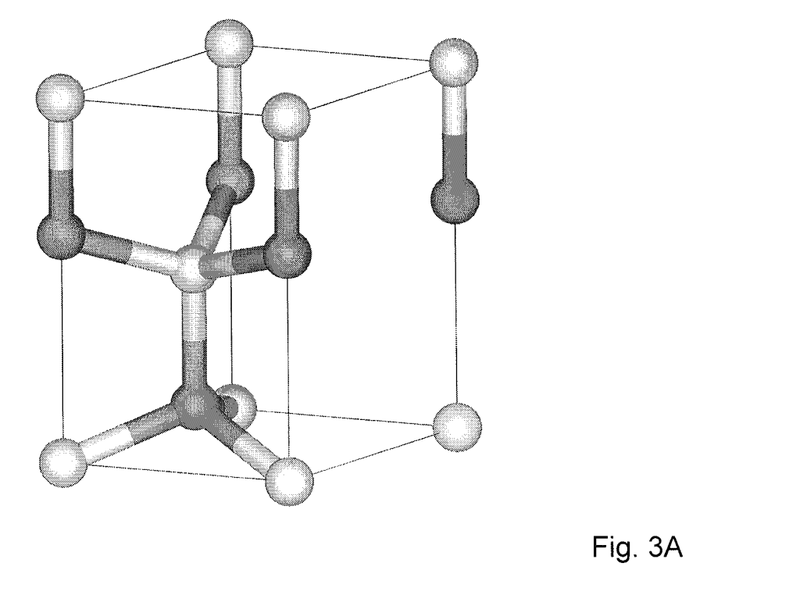
FIG. 3A shows a unit cell of wurtzite.

FIG. 3A shows a unit cell of the wurtzite crystal structure. The wurtzite crystal structure is a crystal structure for various binary compounds (i.e. comprising two different atom types). Each of the two individual atom types forms a sub-lattice which is hexagonal close-packed. Each atom is tetrahedrally coordinated. The wurtzite structure is non-centrosymmetric (i.e. lacks inversion symmetry).

If the crystal has wurtzite structure, it should be oriented such that the laser radiation is parallel (or substantially parallel) to the [0001] axis to reduce the second harmonic.

Figure 3B:
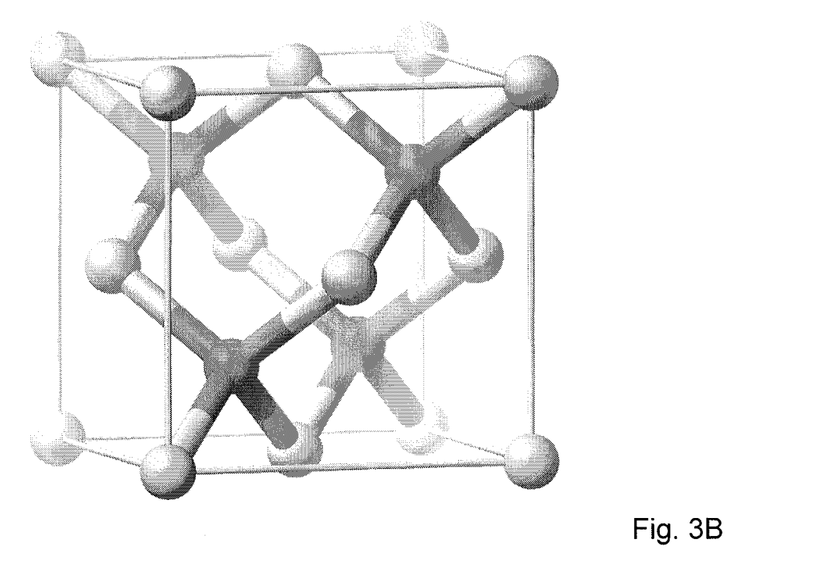
FIG. 3B shows a unit cell of zinc-blende.

FIG. 3B shows a unit cell of zinc-blende. The zinc-blende structure consists of two atom types forming two interpenetrating face-centred cubic lattices. The zinc-blende structure has tetrahedral coordination, i.e. each atom's nearest neighbours consist of four atoms of the opposite type, positioned like the four vertices of a regular tetrahedron. Altogether, the arrangement of atoms in zinc-blende structure is the same as diamond cubic structure, but with alternating types of atoms at the different lattice sites.

If the crystal has zinc-blende structure, it is oriented such that the laser radiation is parallel to one of the [100], [010], or [001] axes to reduce the second harmonic.

Figure 4:
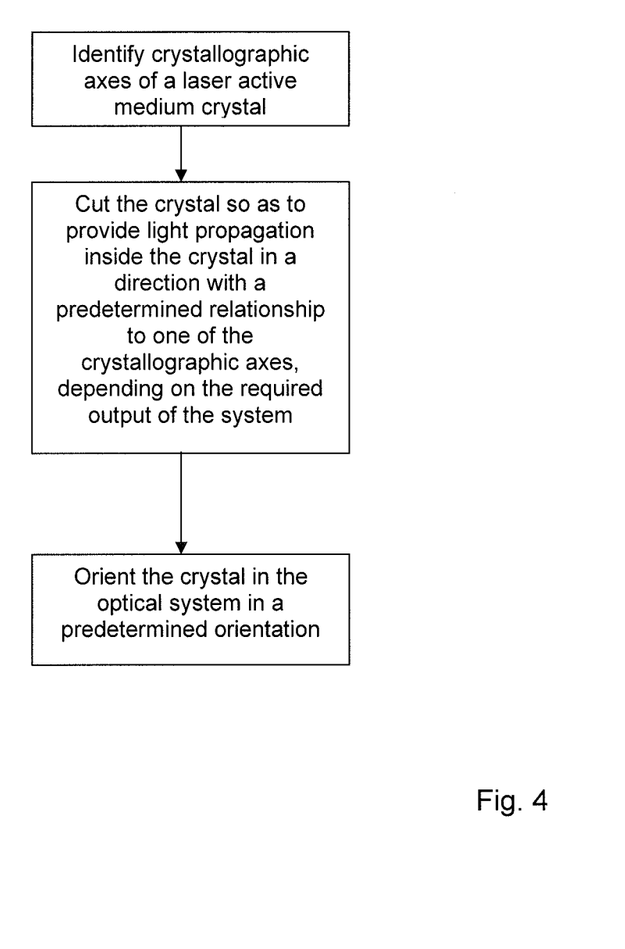
FIG. 4 shows a method for optimising output of a laser.

FIG. 4 shows a method of optimising the laser output, i.e. setting in advance the degree of generation of second harmonic radiation. In the first step of the method, the crystallographic axes of an active laser gain medium crystal are identified. In the second step, the crystal is cut in a way to provide light propagation along one of the crystallographic axes, taking refraction (e.g. Brewster) into account. The choice of particular axis is determined based on whether it is desirable to enhance or reduce second harmonic radiation (see FIG. 5). In the third step, the crystal is oriented in an optical system in a predetermined orientation relative to a propagation vector of a laser pulse.

Figure 5:
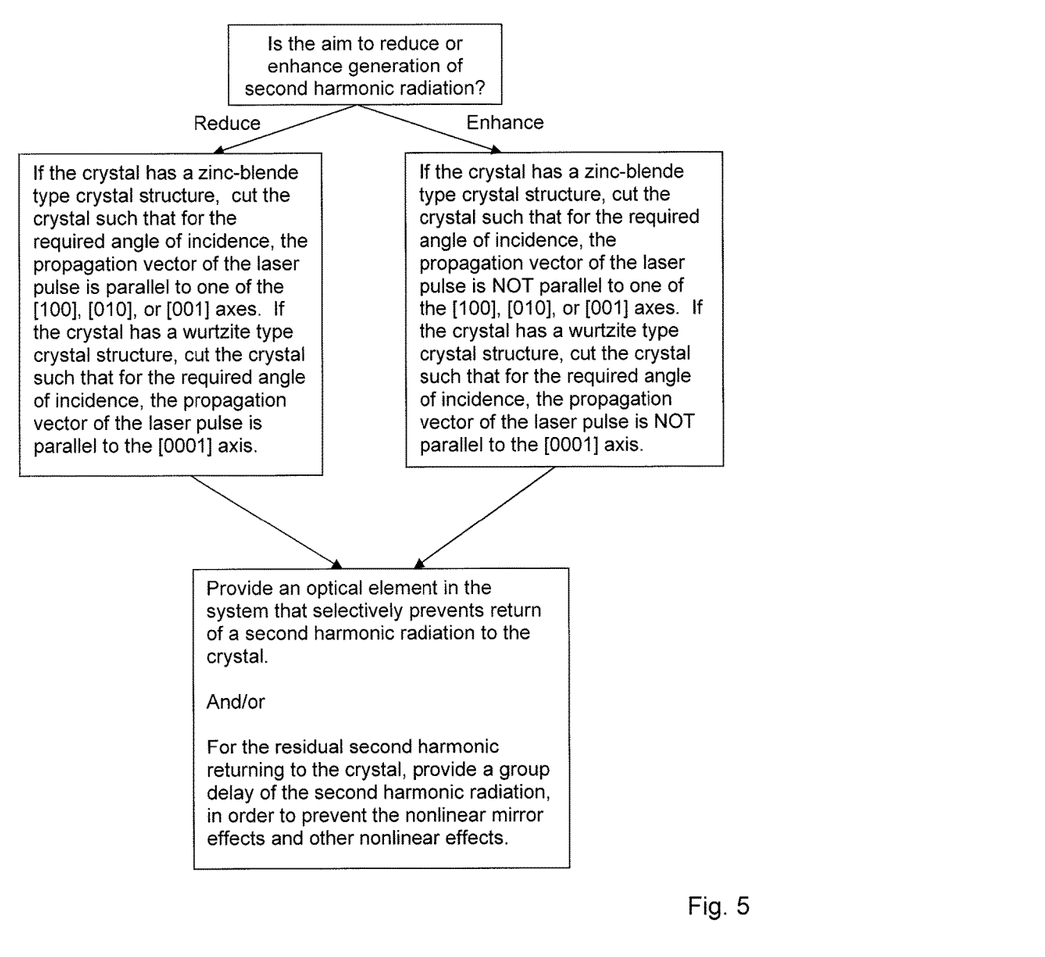
FIG. 5 shows further detail of the method for optimising output of a laser, in particular in relation to the step of cutting the crystal depending on the required output of the optical system.

FIG. 5 sets out further detail in relation to the step of cutting the crystal in the method shown in FIG. 4.

Figure 6:
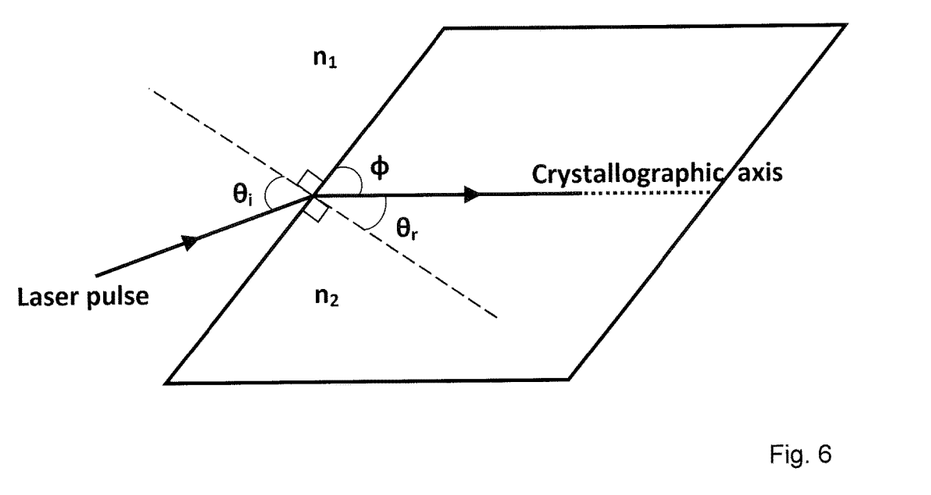
FIG. 6 shows a schematic ray diagram of laser pulse propagation through the crystal.

FIG. 6 shows a schematic ray diagram of laser pulse propagation through the crystal.

In particular, if it is important to minimise second harmonic generation, and the active laser gain medium has a zinc-blende type crystal structure, the method comprises orienting the crystal such that the propagation vector of the laser pulse is substantially parallel to one of the [100], [010], or [001] crystallographic axes.

If the propagation vector of the laser pulse is in any other direction than parallel to the [100], [010], or [001] crystallographic axes, this will result in generation of second harmonic radiation, which may in some circumstances be desirable. For example, the second harmonic radiation can be used to measure and control a carrier-envelope offset frequency of a fundamental pulse according to the f-2f scheme. Alternatively, the second harmonic radiation can be used as an output of the laser optical system, or as the main output of the laser optical system (instead of the fundamental).

If it is important to minimise second harmonic generation and the active laser gain medium has a wurtzite type crystal structure, the method comprises orienting the crystal such that the propagation vector of the laser pulse is substantially parallel to the [0001] crystallographic axes. If the propagation vector of the laser pulse is in any other direction than parallel to the [0001] crystallographic axis, this will result in generation of second harmonic radiation, which may in some circumstances be desirable.

To make sure that the propagation vector of the laser pulse in the laser crystal is oriented in a predetermined way with respect to a predetermined crystallographic axis (shown as the dotted line in FIG. 6), in order to either eliminate a second harmonic or to increase a second harmonic, the desired angle of incidence $\theta_i$ must be considered, and then the crystal must be cut at the correct angle relative to the predetermined crystallographic axis.

The angle that the cut face of the crystal makes with respect to the crystallographic axis is denoted by Φ (see FIG. 6). By Snell's Law, when the propagation vector of the laser pulse within the laser crystal is substantially parallel to the predetermined crystallographic axis (to eliminate the second harmonic), Φ is given by the following equation:

$$\Phi = 90 - \arcsin\left(\frac{n_1}{n_2}\sin\theta_i\right)$$

Here, $\theta_i$ is the angle of incidence, $n_1$ is the refractive index of the medium through which the laser propagates before being incident upon the crystal (usually air) and $n_2$ is the refractive index of the crystal.

In embodiments where it is desirable for the output of the system to include the second harmonic (i.e. the propagation vector of the laser pulse within the laser crystal is not substantially parallel to the predetermined crystallographic axis), then Φ can take any value between 0° and 90° except for:

$$90 - \arcsin\left(\frac{n_1}{n_2}\sin\theta_i\right)$$

This is summarised in the following table for zinc-blende and wurzite:

|  | Zinc-blende | Wurzite |
|---|---|---|
| Fundamental only | Cut so that: $\Phi = 90 - \arcsin\left(\frac{n_1}{n_2}\sin\theta_i\right)$ relative to one of the [100], [010] or [001] axes | Cut so that $\Phi = 90 - \arcsin\left(\frac{n_1}{n_2}\sin\theta_i\right)$ relative to the [0001] axis |
| Fundamental and second harmonic | Cut so that: $\Phi \neq 90 - \arcsin\left(\frac{n_1}{n_2}\sin\theta_i\right)$ relative to one of the [100], [010] or [001] axes | Cut so that $\Phi \neq 90 - \arcsin\left(\frac{n_1}{n_2}\sin\theta_i\right)$ relative to the [0001] axis |

It may be necessary to further reduce the effects of the second harmonic radiation (particularly if the active laser medium is polycrystalline). In that case, the method further comprises the step of providing an optical element (not shown) which attenuates the second harmonic or otherwise separates out the second harmonic from the fundamental radiation. Some non-limiting examples of such elements are: an optical element for preventing return of a second harmonic of the laser radiation to the active laser gain medium; a mirror having a reflection coefficient in the second harmonic wavelength range that is smaller than the reflection coefficient in the fundamental wavelength range; an intracavity element with higher absorption in the second harmonic wavelength range compared to absorption in the fundamental wavelength range.

In all cases of non-zero second-harmonic generation (desired or residual) an optical element which provides a group delay of the second harmonic radiation with respect to the laser pulse that is longer than a duration of the laser pulse (for example, a bulk dispersion compensator, a prism pair, a wedge or wedge pair, a dispersion-controlling chirped mirror, or a Gires-Tournois interferometer) would further decrease the negative consequences of the nonlinear mirror effect such as temporal or spectral modulation, mode-locking instability, and environmental sensitivity.

CLAUSES

The following clauses set out features of the invention which may not presently be claimed in this application, but which may form the basis for future amendment or a divisional application.
1. An optical system comprising:
   an active laser crystal, dielectric or semiconductor, with the present non-phasematched second-order nonlinearity;
   an optical system comprising of the set of mirrors, saturable absorbers and dispersive elements to provide generation and/or amplification of ultra-short pulses;
   the said laser crystal being orientated in a way to effectively suppress generation of the second harmonic of the laser radiation, or, when this is impossible, the said optical system being designed in a way to either prevent return of the second harmonic to the said laser system or to provide group delay of the second harmonic radiation with respect to the laser pulse longer than the duration of the laser pulse.
2. An optical system according to clause 1 where the active laser crystal is selected from the group consisting of sulfides, selenides, and tellurides, and a transition metal ion dopant in the host material, wherein:
   said transition metal ion dopant is selected from the group consisting of Ti, V, Cr, Mn, Fe, Co, Ni, and Cu;
3. The active laser crystal of clause 2, wherein said host material is a II-VI compound having the formula MX, where M is a divalent cation selected from the group consisting of Mg, Zn, and Cd, or a combination of those, and X is a divalent anion selected from the group consisting of S, Se and Te, or a combination of those;
4. The laser crystal of clause 3, wherein said active laser crystal is a single crystal material.
5. The laser crystal of clause 3, wherein said active laser crystal is a polycrystalline material.
6. The laser crystal of clause 3, wherein said host material is selected from the group consisting of ZnS, ZnSe, ZnTe, CdS, CdSe and CdTe;
7. The laser gain medium of clause 6 wherein the transition metal ion is $Cr^{2+}$.
8. The laser gain medium of clause 6 wherein the transition metal ion is $Fe^{2+}$.
9. A laser gain medium comprising:
   a host material selected from the group consisting of oxides, sulfides, selenides, tellurides, fluorides, chlorides, bromides, and iodides, and a transition metal ion dopant in the host material, wherein:
   the transition metal ion is has a $3d^4$, $4d^4$, $5d^4$, $3d^6$, $4d^6$, or $5d^6$ electronic structure and by ground and excited states described by $^5T_2$ and $^5E$ tetrahedral symmetries;

said host material has a crystal structure having four fold coordinated substitutional sites;
said transition metal ion dopant is substituted at said four-fold coordinated sites;
said host material has non-centrosymmetric crystal structure.
10. The laser gain medium of clause 9 wherein:
said host material is selected from the group consisting of sulfide, selenide and telluride host materials;
said transition metal ion dopant is selected from the group consisting of Ti, V, Cr, Mn, Fe, Co, Ni, and Cu.
11. The laser gain medium of clause 10 wherein the transition metal ion is $Cr^{2+}$.
12. An optical system according to clause 1 generating or amplifying femtosecond or chirped picosecond pulses and having its host crystal in such orientation as to completely suppress second harmonic generation (propagation vector of the light pulse in zinc-blende type crystal is parallel to one of the crystallographic axes [100], [010], or [001]; or to the crystallographic axis [0001] for wurtzite structure).
13. An optical system according to clause 1 or 10 generating or amplifying femtosecond or chirped picosecond pulses where mirror are designed to provide very small reflection coefficients in the second harmonic wavelength range.
14. An optical system according to clause 1 or 10 generating or amplifying femtosecond or chirped picosecond pulses where intracavity elements are introduced with high absorption in the second harmonic wavelength range to prevent re-entry of the second harmonic radiation back to the active crystal.
15. An optical system according to clause 1 or 10 generating or amplifying femtosecond or chirped picosecond pulses where intracavity elements such as bulk dispersion compensators or dispersion-controlling chirped and Gires-Tournois interferometers providing additional delay of the second harmonic radiation longer than the duration of the fundamental pulse before re-entry into the active medium.
16. An optical system according to clause 1 or 10 generating few-cycle femtosecond pulses where the second harmonic radiation, emitted from one of the cavity mirrors, is used to measure and control the carrier-envelope offset frequency of the fundamental pulse according to the f-2f scheme.
17. An optical system according to clause 1 or 10 generating femtosecond or chirped picosecond pulses where the second harmonic radiation, emitted from one of the cavity mirrors, is used as an additional useful output of the laser, extending its applications possibilities.
18. An optical system according to clause 1 or 10 generating femtosecond or chirped picosecond pulses where the second harmonic radiation, emitted from one of the cavity mirrors, is used as a main useful output of the laser, with no or very little output at fundamental wavelength.

It should be apparent that the foregoing relates only to the preferred embodiments of the present application and the resultant patent. Numerous changes and modification may be made herein by one of ordinary skill in the art without departing from the general spirit and scope of the invention as defined by the following claims and the equivalents thereof.

I claim:
1. An optical system for a mode-locked laser oscillator or a regenerative, multi-pass or single pass amplifier, the optical system comprising:
an active laser gain medium having a crystalline structure with non-phase-matched second-order optical non-linearity,
wherein the active laser gain medium is orientated such that a crystallographic axis thereof is parallel to a propagation vector of a laser pulse of laser radiation to reduce generation of a second harmonic of the laser radiation;
wherein the active laser gain medium comprises a host material selected from the group consisting of sulfides, selenides, and tellurides; and
wherein the active laser gain medium comprises a transition metal ion dopant in the host material.
2. An optical system according to claim 1, wherein the active laser gain medium crystal having refractive index $n_2$, the optical system being configured such that laser pulses are incident on the crystal at a predetermined angle of incidence $\theta_i$ from a medium preceding the crystal having refractive index $n_1$, wherein the crystal has a cut face which is at an angle $\Phi$ to a predetermined crystallographic axis of the crystal so that:

$$\Phi = 90 - \arcsin\left(\frac{n_1}{n_2}\sin\theta_i\right)$$

whereby, the crystal is configured to minimise generation of the second harmonic or wherein the crystal has a cut face which is at an angle $\Phi$ to a predetermined crystallographic axis of the crystal so that:

$$\Phi \neq 90 - \arcsin\left(\frac{n_1}{n_2}\sin\theta_i\right)$$

whereby, the crystal is configured to increase generation of the second harmonic.
3. An optical system according to claim 2, wherein the active laser gain medium has a zinc-blende type crystal structure and the propagation vector of the laser pulse in the laser crystal is parallel to one of the [100], [010], or [001] crystallographic axes to reduce the generation of the second harmonic radiation, or wherein the active laser gain medium has a wurtzite type crystal structure and the propagation vector of the laser pulse in the laser crystal is parallel to the [0001] crystallographic axis to reduce the generation of the second harmonic radiation.
4. An optical system according to claim 1, wherein the optical system comprises an optical element for preventing return of a second harmonic of the laser radiation to the active laser gain medium, either comprising a mirror having a reflection coefficient in the second harmonic wavelength range that is smaller than the reflection coefficient in the fundamental wavelength range or comprising an intracavity element with higher absorption in the second harmonic wavelength range compared to absorption in the fundamental wavelength range.
5. An optical system according to claim 1, wherein the optical system comprises an optical element for providing a group delay of the second harmonic radiation with respect to a laser pulse that is longer than a duration of the laser pulse.
6. An optical system according to claim 5 comprising an intracavity element providing an additional delay of the second harmonic radiation that is longer than the duration of the fundamental pulse before re-entry into the active medium, wherein the intracavity element providing the additional delay is a bulk dispersion compensator, a prism pair, a wedge or wedge pair, a dispersion-controlling chirped mirror, or a Gires-Tournois interferometer.

7. An optical system according to claim 1, comprising a cavity mirror,
wherein the second harmonic radiation reflected or transmitted by the cavity mirror is used to measure and control the carrier-envelope offset frequency of the fundamental pulse according to the f-2f scheme or wherein the second harmonic radiation reflected or transmitted by the cavity mirror is used as an additional output of the laser.

8. An optical system according to claim 1, comprising a cavity mirror,
wherein the second harmonic radiation reflected or transmitted by the cavity mirror is used as a main useful output of the laser, with no or very little output at the fundamental wavelength.

9. An optical system according to claim 1, wherein the active laser gain medium is a single crystal material, or wherein the active laser gain medium is a polycrystalline material.

10. An optical system according to claim 1 where
the transition metal ion is has a $3d^4$, $4d^4$, $5d^4$, $3d^6$, $4d^6$, or $5d^6$ electronic structure and by ground and excited states described by $^5T_2$ and $^5E$ tetrahedral symmetries;
the host material has a crystal structure having four fold coordinated substitutional sites;
the transition metal ion dopant is substituted at said four-fold coordinated sites; and
the host material has a non-centrosymmetric crystal structure, or
wherein the transition metal ion dopant is selected from the group consisting of Ti, V, Cr, Mn, Fe, Co, Ni, and Cu; or
wherein the transition metal ion is $Cr^{2+}$ or $Fe^{2+}$.

11. An optical system according to claim 10, wherein said host material is a group II-VI compound having the formula MX, where M is a divalent cation selected from the group consisting of Mg, Zn, and Cd, or a combination of those, and X is a divalent anion selected from the group consisting of S, Se and Te, or a combination of those, and wherein said host material is selected from the group consisting of ZnS, ZnSe, ZnTe, CdS, CdSe and CdTe; or wherein the transition metal ion is $Cr^{2+}$.

* * * * *